United States Patent [19]

Kessler, Jr. et al.

[11] 4,386,362

[45] May 31, 1983

[54] CENTER GATE SEMICONDUCTOR DEVICE HAVING PIPE COOLING MEANS

[75] Inventors: Sebastian W. Kessler, Jr.; Robert E. Reed, both of Lancaster, Pa.

[73] Assignee: RCA Corporation, New York, N.Y.

[21] Appl. No.: 107,014

[22] Filed: Dec. 26, 1979

[51] Int. Cl.³ .................... H01L 23/48; H01L 29/44; H01L 29/52

[52] U.S. Cl. ..................... 357/68; 357/17; 357/74; 357/81; 357/82

[58] Field of Search ............. 357/81, 82, 66, 68, 357/74, 17

[56] References Cited

U.S. PATENT DOCUMENTS

| | | | |
|---|---|---|---|
| 1,865,213 | 6/1932 | Ruben | 357/82 |
| 3,296,506 | 1/1967 | Steinmetz . | |
| 3,450,962 | 6/1969 | Ferree et al. . | |
| 3,577,042 | 5/1971 | Roach . | |
| 3,590,338 | 6/1971 | Roberts | 357/79 |
| 3,599,057 | 8/1971 | Lootens . | |
| 3,729,659 | 4/1973 | Bennett et al. | 357/79 |
| 3,739,235 | 6/1973 | Kessler | 357/82 |
| 3,771,027 | 11/1973 | Marek | 357/82 |
| 3,946,429 | 3/1976 | Kessler | 357/82 |
| 3,984,861 | 10/1976 | Kessler | 357/82 |
| 4,129,881 | 12/1978 | Reichel et al. | 357/66 |
| 4,158,850 | 6/1979 | Lehmann . | |
| 4,183,042 | 1/1980 | Novak et al. | 357/68 |
| 4,263,607 | 4/1981 | Legrand et al. | 357/68 |

*Primary Examiner*—Andrew J. James
*Attorney, Agent, or Firm*—Eugene M. Whitacre; Dennis H. Irlbeck; Vincent J. Coughlin, Jr.

[57] ABSTRACT

A transcalent semiconductor device comprises a body of semiconductor material having first and second major opposed surfaces. The first surface includes at least one region of first type conductivity and a region of opposite type conductivity. A first heat pipe having a conductive contact disc is in electrical and thermal contact with substantially all of the first surface. The conductive contact disc has an aperture therein. A control electrode for initiating conduction through the semiconductor material extends through the aperture in the disc and contacts the region of opposite type conductivity. A second heat pipe is disposed in electrical and thermal conductive relationship with the second surface. In an alternative embodiment, a fiber optic light pipe controls the initiation of conduction through the semiconductor material by transmitting photons to the region of opposite type conductivity.

33 Claims, 7 Drawing Figures

CENTER GATE SEMICONDUCTOR DEVICE HAVING PIPE COOLING MEANS

BACKGROUND OF THE INVENTION

The invention relates to a semiconductor transcalent device and, more particularly, to a transcalent device of a center gate type in which a control or gating means is in communication with the center of one surface of a semiconductor wafer.

The term transcalent device is used to describe a family of high power solid state devices that include integral cooling systems. These devices are constructed to minimize the thermal resistance between a semiconductor wafer, such as silicon or germanium which is the active part of the device, and the utlimate heat sink. Such semiconductor devices include, for example, thyristors, silicon-controlled rectifiers (SCR) and transistors. All these devices produce relatively large amounts of heat, which must be effectively dissipated to prevent breakdown or destruction of the device. Different types of heat sinks have been used. One type utilizes a heat pipe structure affixed to the semiconductor wafer.

One type of heat pipe comprises a porous wick structure in direct contact with the cathode and anode electrodes of the semiconductor wafer. Such a heat pipe is described in U.S. Pat. No. 3,739,235 to S. W. Kessler Jr., issued June 12, 1973, entitled, "Transcalent Semiconductor Device." A second type of heat pipe comprises metal plates of tungsten or molybdeum bonded to the respective cathode and anode electrodes of the semiconductor wafer. The metal plates in turn are conductively bonded to the heat pipe walls. Such a heat pipe structure is described in U.S. Pat. No. 3,984,861 to S. W. Kessler Jr., issued Oct. 5, 1976, entitled, "Transcalent Semiconductor Device." In each of the above-mentioned patents the control electrode for initiated conduction in the semiconductor wafer is disposed at or near the periphery of the wafer adjacent to the cathode electrode. Devices of the above-described type are known as "ring gate" type devices and form a major class of semiconductor devices.

The second major class of semiconductor devices is known as "center gate" devices. In a center gate device the control or gate lead usually contacts a gate electrode located at the center of the silicon wafer. In certain applications a center gate device may be preferably to a ring gate device. For example, in a center gate structure with or without an amplifying gate a smaller area of silicon is necessary for the gate contact than with a ring gate type device. Furthermore, with a center gate it is easier to obtain a higher transient rate of voltage rise (dv/dt) because the periphery of the gate to emitter junction is smaller and therefore spurious electrical leakage and capacitive displacement currents are less than if the periphery were as large as with a ring gate. Also, the emitter area per unit area of silicon wafer, is greater for a center gate device than for a similar size ring gate device resulting in increased current ratings for the same area of silicon.

Semiconductor devices of the "center gate" type are well known in the art. Such devices and various structures for contacting the centrally disposed gate electrode are shown in U.S. Pat. No. 3,296,506, to Steinmetz Jr. et al., issued on Jan. 3, 1967, entitled, "Housed Semiconductor Device Structure with Spring Biased Control Lead," U.S. Pat. No. 3,450,962 to Ferree et al., issued June 17, 1969, entitled, "Pressure Electrical Contact Assembly For a Semiconductor Device," and U.S. Pat. No. 3,599,507 to Lootens, issued on Aug. 10, 1971, entitled, "Semiconductor Device with a Resilient Lead Construction." These above-mentioned devices achieve cooling of the semiconductor wafer by heat conduction through a metal support member. Devices having a metal support member have limited applicability in applications requiring higher current and power ratings where excessive heat is generated, and more efficient means for transferring heat from the semiconductor device is required.

U.S. Pat. No. 3,771,027 to Marek, issued Nov. 6, 1973, entitled, "Bistable Semiconductor Device," describes a center gate type semiconductor device cooled by the heat pipe technique. The Marek structure apparently assumes that the coolant is a nearly perfect dielectric since in FIG. 4 of the patent the coolant is simultaneously in contact with both the emitter and the gate regions of the semiconductor. The shorting problem that may occur in the Marek structure because of the less than perfect dielectric property of the coolant is eliminated by applicants' novel control structure which furnishes both a substantially continuous heat transfer surface in contact with the surface of the wafer and a structure in which the coolant is not in contact with the surface of the wafer.

SUMMARY OF THE INVENTION

A transcalent semiconductor device comprises a body of semiconductor material having first and second major opposed surfaces. A first heat pipe having a conductive contact disc is in electrical and thermal contact with substantially all of the first surface. The conductive contact disc of the first heat pipe has an aperture therein. Control means for initiating conduction through the semiconductor material extend through the aperture in the contact disc and communicate with a portion of the first surface. A second electrical contact means is disposed in electrical and thermal conductive relationship with the second surface.

DETAILED DESCRIPTION OF THE PREFERRED EMBODIMENT

Figure 1:
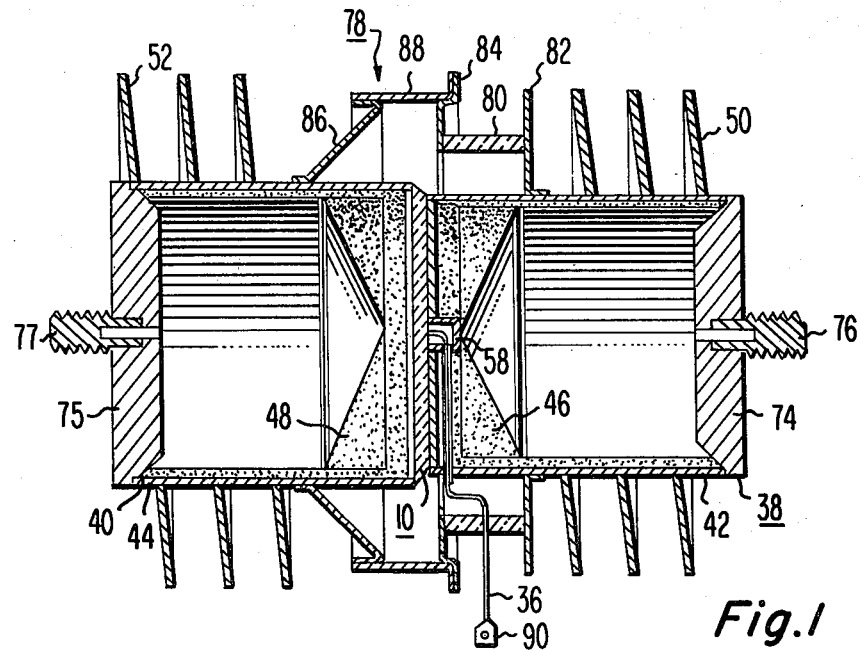
FIG. 1 is a cross section of a transcalent semiconductor device incorporating one embodiment of the novel center control structure.
Figure 2:
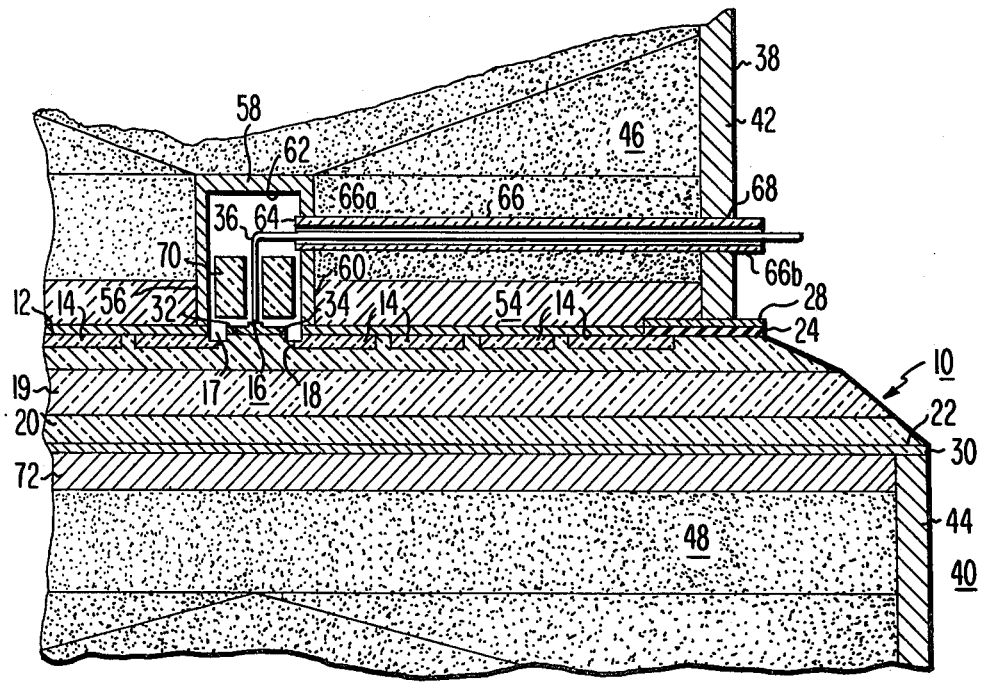
FIG. 2 is an enlarged fragmentary view of a transcalent thyristor device incorporating the novel center gate control structure.

A specific embodiment of the novel structure is shown in FIGS. 1 and 2 as a transcalent semiconductor thyristor cooled by heat pipe structures bonded to the thyristor. The device comprises a semiconductor wafer 10 of silicon which is formed of layers of doped semiconductor material forming an NPNP semiconductor thyristor device. Although not shown in the FIGURES the configuration of the wafer 10 is that of a substantially round disc. Shown in detail in FIG. 2, the layered wafer 10 includes, on a first major surface 12, a plurality of first emitter regions 14 of N type conductivity alternating with a first base region 16 of P type conductivity. That portion of the first base region 16 bordering the first emitter regions 14 provides shorting elements, well-known in the art, to insure that thermal and displacement currents do not accidentally initiate conduction in the device. An island of the first base region material 16 located at the center of the wafer 10 is surrounded by a moat 17 etched into the first surface 12 of the wafer 10. The moat 17 is etched through a portion of an innermost P-N junction-surface intersection 18. The moat 17 serves to force the starting current deeper into the wafer 10 to aid the spread of current through the wafer. A second base region 19 of N type conductivity is contiguous with the first base region 16. A second emitter region 20 of P type conductivity is contiguous with the second base region 19 and forms a second major surface 22 of the wafer 10. The first major surface 12 is substantially parallel to the second major surface 22.

A thin annular-shaped electrically insulating layer 24 of thermally grown silicon dioxide may be disposed on the first major surface 12 of the wafer 10. The layer 24 extends across an outer P-N junction-surface intersection 26. The layer 24 prevents shorting of the first base region 16 as disclosed hereinafter. The layer 24 may be eliminated by extending the outermost emitter region 14 to the periphery of the wafer. A cathode electrode metallizing coating 28 is disposed on substantially all of said first major surface 12 and overlies the first emitter regions 14, the shorting elements of the first base region 16 and the insulating layer 24. An anode electrode metallizing coating 30, identical to coating 28, is disposed on the second major surface 22 of the wafer 10.

On the first major surface 12 of the wafer 10 and disposed at the center of the wafer 10 within a portion of the first base region 16 and insulatingly spaced from the cathode electrode coating 28 is a gate metallizing coating 32, identical to coatings 28 and 30 forming the gate electrode 34. The metallizing coatings 28, 30, and 32 comprise successive layers of palladium, tungsten and nickel as described in U.S. Pat. No. 3,739,235, issued June 12, 1973, and incorporated by reference herein. A conductive metal control lead structure 36 is attached, for example, by soldering, to the gate electrode 34. Bonded directly to the metallized opposed major surfaces of the wafer 10 and in thermal contact therewith are two heat pipes, respectively 38 and 40. The first heat pipe 38 provides an electrical contact to the cathode electrode 28 and the second heat pipe 40, provides an electrical contact to the anode electrode 30. The insulating layer 24 disposed between the periphery of the first surface 12 of wafer 10 and the cathode electrode 28 prevents shorting between the cathode electrode 28 and the first base region 16. The heat pipes include two hermetically sealed envelopes comprising copper cylinder 42 and 44 such as those described in U.S. Pat. No. 3,984,861 cited above and incorporated by reference herein. As is well-known and described in the above-cited U.S. patent, the heat pipes 38 and 40 include wick liners 46 and 48, respectively, which consist primarily of porous copper layers in which an amount of working fluid, such as water (not shown), is used. To further aid in the cooling of the heat pipe cylinders, a first spiral thin metal fin structure 50 as shown in FIG. 1, is bonded to the external surface of cylinder 42 and a similar second fin structure 52 is bonded to the external surface of the cylinder 44. The fins 50 and 52 provide a greater surface area for air cooling of the outer surface of the heat pipe cylinders 42 and 44, respectively. One end of the first cylinder 42 is hermetically closed by a metal wall portion consisting of a round contact disc 54 metal-brazed around its periphery across and to the open end of cylinder 42. The contact disc 54 which may be made of either molybdenum or tungsten but preferably molybdenum, has a centrally located control disc aperture 56 extended therethrough.

Disposed within the disc aperture 56 is a concave member 58 made of either copper or molybdenum but preferably molybdenum, having a exterior wall surface 60 hermetically bonded, as by brazing, to the disc 54. The concave member 58 forms a recessed chamber having an interior wall surface 62. The recessed chamber is directed outwardly from the first heat pipe 38. The concave member 58 further includes a control aperture 64 extending through the interior and exterior wall surfaces 62 and 60, respectively, of said concave member 58. A hollow tubular member 66 extends through a hole formed in the wick liner 46 and between the control aperture 64 and an external surface aperture 68 extending through the first copper cylinder 42. The tubular member 66 is hermetically sealed as by brazing at one end 66a to the surfaces of concave member 58 circumscribing the control aperture 64 and at a second end 66b to the cylinder 42 circumscribing the external surface aperture 68. The tubular member 66 provides a conduit for the gate lead 36. The tubular member 66 is preferably made of a nonconductive material such as high alumina ceramic, metallized and plated at both ends thereof, in a manner well-known in the art, to facilitate brazing, although the tubular member 66 may be a conductive cylinder if the gate electrode lead 36 is insulated therefrom. A nonconductive annular body 70 may be disposed within the concave member 58 to prevent the gate lead 36 from contacting the interior wall surface 62 of the concave member 58.

The corresponding open end of the second copper cylinder 44 is hermetically closed by an imperforate second contact disc 72 also made of either molybdenum or tungsten, but preferably molybdenum, metal-brazed around its periphery and across its open end. The opposite end of cylinders 42 and 44 are hermetically closed as by brazing by respective plates 74 and 75 as indicated in FIG. 1. The external circuit (not shown) is attached to cylinders 42 and 44, for example, by threaded bolts 76 and 77 fixed to the end plates 74 and 75, respectively.

To further protect and shield the exposed portions of the semiconductor wafer 10 there is provided an envelope structure 78 extending between the two heat pipes. The envelope structure 78 includes a ceramic cylinder 80 coaxially positioned around the first heat pipe cylinder 42 and bonded to the wall of cylinder 42 by a Kovar (Trademark) flange-disc 82 brazed at its outer periphery to one end of the ceramic cylinder 80 and at its inner periphery to the outer wall of cylinder 42. A first cold rolled steel weld flange 84 is brazed at its inner periphery to the other end of the ceramic cylinder 80.

Envelope structure 78 also includes a Kovar conical connecting flange 86 brazed between the outer wall of the second heat pipe cylinder 44 and one end of a second cold rolled steel weld flange 88. The other end of the second weld flange 88 is welded to the outer periphery of the first weld flange 84. The gate lead 36 to the gate electrode 34 extends through a hermetically sealed opening in the ceramic cylinder 80 and is attached to a lead terminal 90 as indicated in FIG. 1 and is used to connect the gate electrode to an external working circuit (not shown).

The soldering of the contact discs 54 and 72 to the metallized surfaces 28 and 30, respectively, of the wafer 10 and the soldering of the gate lead 36 to the gate electrode 34 may be done simultaneously. The techniques of soldering and brazing are well-known in the art and need not be described.

While the hollow tubular member 66 is shown in FIG. 2 as extending through the wick liner 46 of the first heat pipe 38, it should be clear to one skilled in the art that by properly relocating and aligning the control aperture 64 of the concave member 58 and the external surface aperture 68 of cylinder 42, the conduit provided by the tubular member 66 for the gate lead 36 may extend through any portion of the interior of the heat pipe 38.

Figure 3:
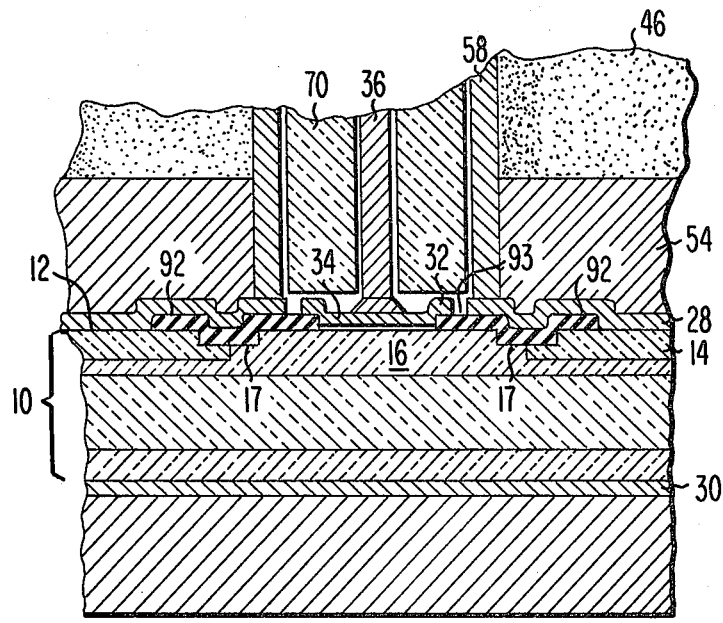
FIG. 3 is an enlarged fragmentary view of a transcalent thyristor device having a second embodiment of the novel center gate control structure.

As shown in FIG. 3 a center gate thyristor structure having a second novel embodiment of the novel center gate control structure with a greater heat dissipating capability than the structure of FIG. 2, includes a second insulating layer 92 of thermally grown silicon dioxide which overlies the moat 17, a portion of the adjacent first emitter region 14, and a portion of the periphery of the island of first base region 16 located at the center of wafer 10. The cathode electrode metallizing coating 28 overlies substantially all of the second insulating layer 92 but is insulated from gate electrode 34 by a narrow ring 93 of the insulating layer 92. The insulating layer 92 permits the moat 17 to be located below and in thermal contact with the contact disc 54 of the first heat pipe 38, to facilitate heat dissipation from the first area of the emitter region 14 to "turn on" when the thyristor is switched from a blocking to a conduction state. The concave member 58 has an inside diameter greater or equal to the outside diameter of narrow ring 93 to prevent electrical shorting between the member 58 and the gate electrode 34. It should be clear to one skilled in the art that if a second concentric gate structure, i.e. a so-called amplifying gate (not shown) is included on the first surface 12 of the wafer 10, the amplifying gate may also be insulated by the second layer of thermally grown silicon dioxide 92 which in turn would be covered by metallizing coating 28, and disposed below and in thermal contact with the contact disc 54 of the first heat pipe 38.

Figure 4:
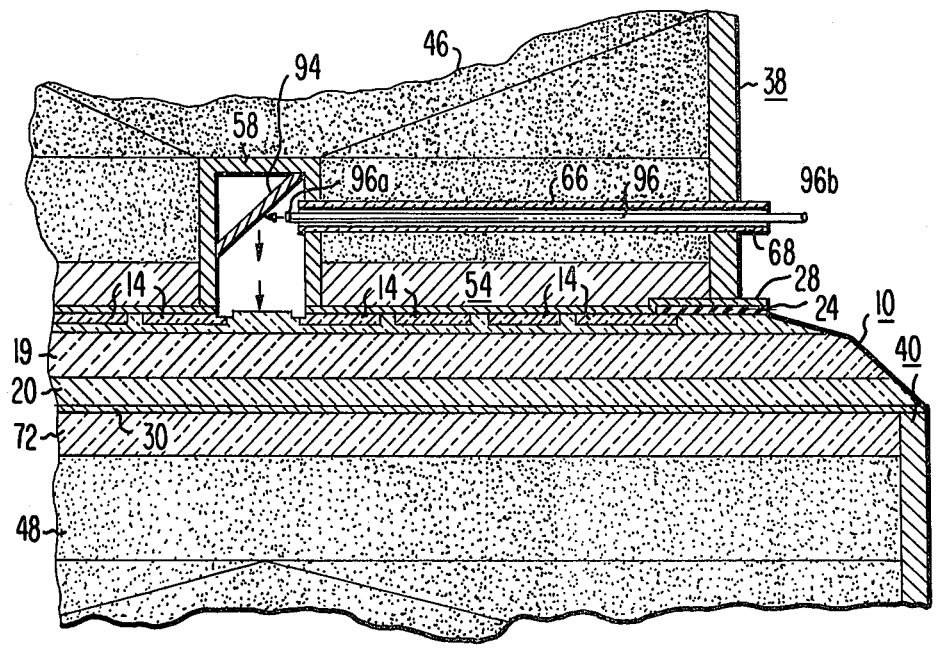
FIG. 4 is an enlarged fragmentary view of a transcalent thyristor device having a third embodiment of the novel center gate control structure.

A center gate thyristor having a third embodiment of the novel gate structure, similar to the structure shown in FIG. 2, is shown in FIG. 4. In this embodiment the gate metallizing coating 32 is omitted from the first base region 16 located at the center of the first major surface 12 of the wafer 10. The gate lead 36 and the annular body 70 are also omitted and a light deflecting member 94, for example, a mirror, is disposed within the concave member 58 in such a manner as to image a light emanating from the hollow tubular member 66 onto the first base region 16 at the center of the wafer 10. As shown in FIG. 4 the light may emanate from a fiber optic light pipe 96 which has a first integral region 96a terminating in the recessed chamber of concave member 58 and a second integral region 96b which extends freely from the external surface aperture 68 of the first heat pipe 38. A light source (not shown) may be located adjacent to the region 96b to provide a source of photons which will initiate conduction in the wafer 10.

Figure 5:
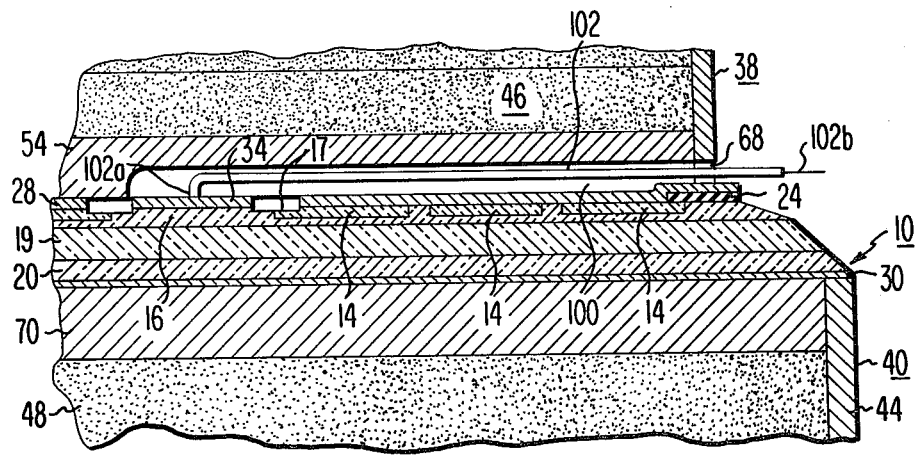
FIG.5 is an enlarged fragmentary view of a transcalent thyristor device having a fourth embodiment of the novel center gate control structure.

A center gate thyristor having a fourth embodiment of the novel gating structure is shown in FIG. 5. In this embodiment, a radially extending slot-like channel 100 is formed in the exterior surface of the contact disc 54. The slot 100 extends from the center of the disc 54 to the edge of the disc and is aligned with the external surface aperture 68. The depth of the slot is not critical but should be sufficiently deep to permit an insulated gate lead 102 to be disposed within the slot in such a manner that the contact disc 54 may be in good thermal and electrical contact with the cathode electrode metallizing coating 28 on the first surface 12 of the wafer 10. The first region 102a of the gate lead 102 is bonded, as by soldering, to the gate electrode 34 of wafer 10. The second region 102b of the gate lead 102 extends freely from the external surface aperture 68 and is used to connect the gate electrode to an external working circuit (not shown). In the embodiment shown in FIG. 5, the first heat pipe structure 38 is similar to the heat pipe shown in FIGS. 1 and 2 except that the contact disc 54 is imperforate and the disc aperture 56, the concave member 58, the hollow tubular member 66, and the annular body 70 are eliminated.

From the foregoing discussion, it should be clear to one skilled in the art that the embodiment described in FIG. 5 can be further modified, for example, by eliminating gate lead 102 and the metallized gate electrode 34, and by adding the light deflecting member 94 described in FIG. 4 at the center of the slot 100. The light deflecting member 94 may be used to direct a light from light source (not shown) located adjacent to the end of slot 100 at the edge of the disc 54 and transmitted either directly through the slot or through the fiber optic light pipe 96 disposed within the slot 100 to the light deflecting member 94 and onto the first base region 16 at the center of the wafer 10.

Figure 6:
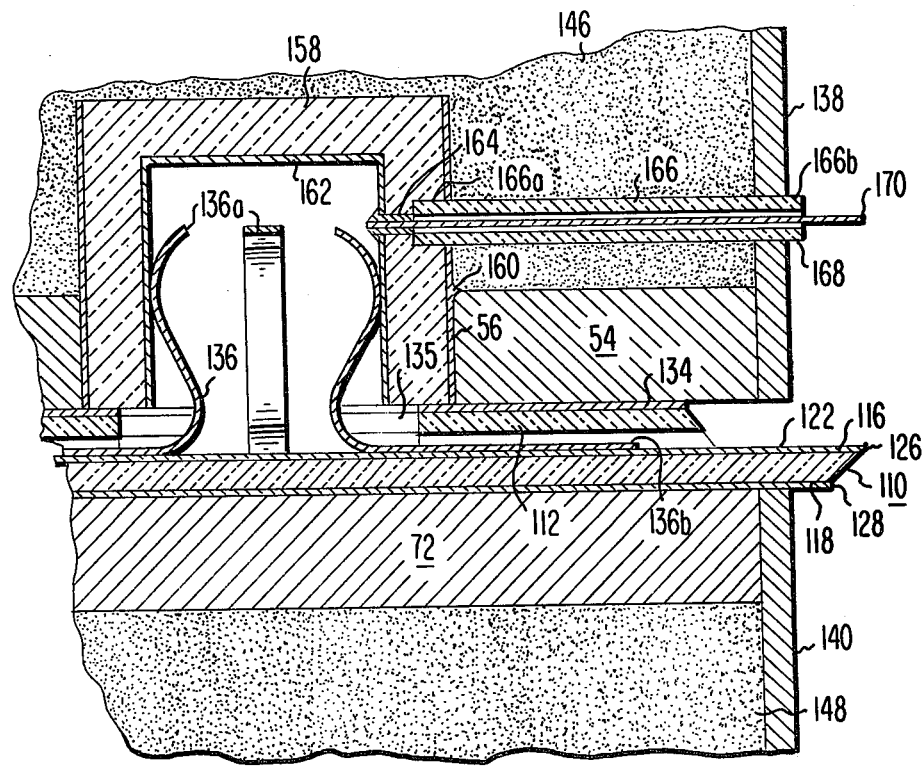
FIG. 6 is an enlarged fragmentary view of a transcalent transistor having a novel center base control structure.
Figure 7:
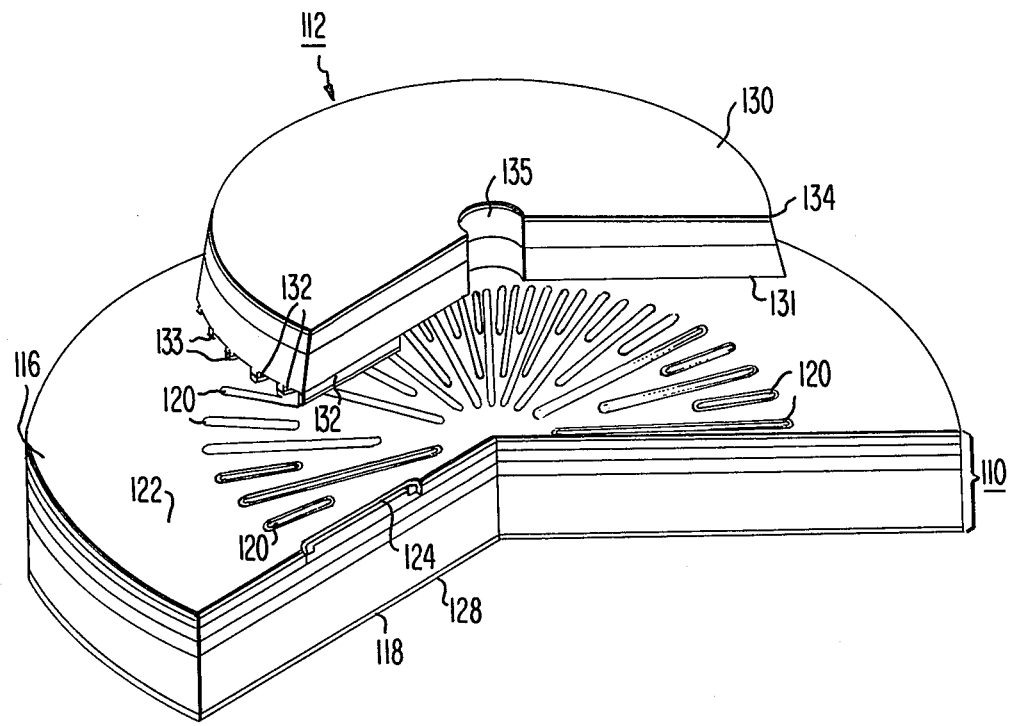
FIG. 7 is a sectional exploded view of a transistor and ballast resistor.

As shown in FIGS. 6 and 7, a novel center contact control structure can also be adapted for use with a transistor 110 that may have a ballast resistor 112 attached thereto. Such a transistor and ballast resistor are disclosed in U.S. Pat. No. 4,126,879, issued on Nov. 21, 1978, to S. W. Kessler Jr. et al., entitled, "Semiconductor Device with Ballast Resistor Adapted for a Transcalent Device," incorporated by reference herein. The above-cited patent discloses a transistor wafer 110 having a first surface 116 and a second surface 118. As shown in FIG. 7, the first surface 116 includes a plurality of radially symmetric emitter regions 120 interdigitated with the base region 122. The emitter regions 120 and the base region 122 each have an electrical contact surface 124 and 126, respectively. The second surface 118 of the transistor 110 further includes a collector contact surface 128 which is planar and adapted to receive another means for conducting heat away from and making electrical contact with, the wafer 110.

The ballast resistor 112 has a substantially flat first resistor surface 130 and a second resistor surface 131 having a plurality of integral mesa fingers 132 extending therefrom. Fingers 132 are arranged in a pattern which forms a mirror symmetric image of the emitter region pattern 120. As described in U.S. Pat. No. 4,126,879, the ballast resistor 112 controls the current flow to each of the emitter regions 120 so as to prevent them from entering thermal run-away. A finger contact surface 133 is provided on the mesa fingers 132 while the first resistor surface 130 is provided with a first resistor contact 134. Contact surfaces 124, 126, 128, 133, and 134 are metallized as described in U.S. Pat. No. 4,126,879. The ballast resistor 112 further includes a resistor aperture 135 extending therethrough to provide means for contacting the base region 122 of the transistor 110 with a base contact spring 136 as shown in FIG. 6. The base contact spring 136 has a plurality of electrical contact fingers 136a at one end thereof and a base contact region 136b at the other end thereof.

In direct thermal contact to the metallized contact surface 134 of the resistor 112 and the surface 128 of the transistor 110 are two heat pipes 138 and 140, respectively. The heat pipes 138 and 140 include wick liners 146 and 148, respectively, which consist primarily of porous copper layers in which a working fluid (not shown) is used. The first heat pipe 138 is similar in construction to heat pipe 38 described above and differs in that a nonconductive concave member 158, e.g., a high alumina ceramic body, having an exterior surface 160 metallized and plated by a process well-known in the art, is disposed in the aperture 56 and brazed to the contact disc 54. A non-conductive material is required for concave member 158 to prevent an electrical short between the contact disc 54 which operates at emitter potential and the base contact spring 136 which operates at base potential. The interior wall surface 162 and nonconductive concave member 158 is also metallized and plated to provide good electrical contact to the base spring contact fingers 136a. The concave member 158 forms a recessed chamber disposed above the resistor aperture 135 and in communication therewith. The concave member 158 further includes a control aperture 164 extending through the ceramic body thereof. As shown in FIG. 6 the control aperture 164 has a step-like contour being of greater diameter adjacent to the exterior surface 160 then near the interior surface 162. A nonconductive hollow tubular member 166 having ends 166a and 166b extends through a hole in the wick liner 146 and between the portion of the control aperture 164 adjacent the exterior surface 160 of concave member 158 and an external surface aperture 168 extending through the first heat pipe 138. The tubular member 166 is metallized, and plated at the ends 166a and 166b, respectively, by a process well-known in the art and is hermetically sealed as by brazing at the end 166a to the concave member 158 and at the second end 166b to the first heat pipe 138 circumscribing the external surface aperture 168. The tubular member 166 provides a conduit for the base lead 170 which is brazed at one end to the interior surface 162 of the concave member 158. The other end of the base lead 170 extends freely from the first heat pipe 138.

The second heat pipe 140 attached as by soldering to the collector contact 128 of the transistor 110 is identical to the heat pipe 40 discussed above in FIGS. 1 and 2. To further protect and shield the exposed portions of the transistor 110 and the resistor 112 an envelope structure (not shown) identical to the above-described envelope structure 78, extends between and contacts the heat pipes. The base lead 170 extends through the envelope and is used to connect the base electrode to an external working circuit (not shown).

What is claimed is:
1. A transcalent semiconductor device compises:
   a body of semiconductor material having first and second major opposed surfaces, said first surface including at least one region of first type conductivity and a region of opposite type conductivity;
   a first electrical contact means disposed on said first surface, said first contact means comprising a first heat pipe having an external surface, an internal surface with a porous wick liner bonded thereto and a conductive contact disc in electrical and thermal contact with substantially all of said first surface, said contact disc having an aperture extending therethrough;
   control means for initiating conduction through said semiconductor material, said control means extending through said external and internal surfaces and through said porous wick liner of said heat pipe and communicating through said aperture with a portion of said first surface comprising the region of opposite type conductivity; and
   a second electrical contact means disposed on said second surface in an electrical and thermal conductive relationship therewith.

2. The device as in claim 1 wherein said aperture circumscribes a concave member having an exterior surface bonded to said disc and an interior surface forming a recessed chamber directed toward the first major surface of said semiconductor body.

3. The device as in claim 2 wherein said concave member includes a control aperture extending through the surfaces thereof, said control aperture providing entry means for said control means.

4. The device as in claim 3 further including a hollow tubular member bonded at one end thereof to the control aperture of said concave member and at the other end thereof to the external surface of said first heat pipe, said external surface having an aperture therethrough, said hollow member providing a conduit for said control means.

5. The device as in claim 4 wherein said hollow tubular member extends through a hole formed in the porous wick liner of said first heat pipe.

6. The device as in claim 5 wherein said hollow tubular member is non-conductive.

7. The device as in claim 6 further including a nonconductive annular disc disposed within the recessed chamber of said concave member, to prevent contact between said control means and the interior surface of said chamber.

8. The device as in claim 7 wherein said control means comprises a continuous control electrode lead wire having a first integral region thereof bonded to the first surface region of opposite type conductivity of the semiconductor body, said continuous control electrode lead wire having a second integral region thereof extending freely from said first heat pipe, all portions of said control electrode lead wire between said first region and said second region being disposed within said concave member and said hollow tubular member and electrically insulated therefrom.

9. The device as in claim 4 wherein said control means comprises a fiber optic light pipe having a first region thereof terminating within said recessed chamber and in optical communication with the first surface region of opposite type conductivity of said semiconductor body, said fiber optic light pipe having a second integral region thereof extending freely from said first heat pipe, all portions of said fiber optic light pipe between said first region and said second region being disposed within said concave member and said hollow tubular member.

10. The device as in claim 4 further including a light deflecting means disposed within said recessed chamber to permit optical communication between said light pipe and said region of opposite type conductivity.

11. The device as in claim 4 wherein the interior surface of said concave member is conductive.

12. The device as in claim 11 wherein said control means comprises:
   a continuous control electrode lead wire having a first integral region thereof bonded to the interior surface of said concave member adjacent to the control aperture, said continuous control electrode lead wire having a second integral region thereof extending freely from said first heat pipe, all portions of said control electrode lead wire between said first region and said second region being disposed within said hollow tubular member, and
   a spring contact having a plurality of contact fingers at one end thereof, said contact fingers being in electrical contact with the interior surface of the concave member, said spring contact having a second end thereof in electrical contact with the first surface region of opposite type conductivity of the semiconductor body.

13. The device as in claim 1 wherein said second electrical contact means comprises a second heat pipe.

14. A transcalent thyristor device comprises:
   a body of semiconductor material having four semiconductor regions arranged in succession of which contiguous regions are of opposite conductivity type with a P-N junction therebetween, said regions including a first emitter region, a first base region, a second base region and a second emitter region;
   means to short the P-N junction between the first emitter region and said first base region;
   first electrical contact means to make electrical contact to said first emitter region, said first electrical contact means includes a first heat pipe having an external surface, an internal surface with a porous wick liner bonded thereto and a conductive disc sealing one end thereof, said disc being in electrical and thermal contact with said first emitter region, said disc having an aperture extending therethrough, and gate means in communication with the first base region for initiating conduction through said thyristor, said gate means extending through said external and internal surfaces and through said porous wick liner of said heat pipe, and second electrical contact means including a second heat pipe in electrical and thermal contact with said second emitter region.

15. The device as in claim 14 wherein said aperture circumscribes a concave member having an exterior surface bonded to said disc and an interior surface forming a recessed chamber directed toward the first base region of the thyristor.

16. The device as in claim 15 wherein said concave member includes a control aperture extending through the surface thereof, said control aperture providing entry means for said gate means.

17. The device as in claim 16 further including a hollow tubular member bonded at one end thereof to the control aperture of said concave member and at the other end thereof to the external surface of said first heat pipe having an aperture therethrough, said hollow member providing a conduit for said gate means.

18. The device as in claim 17 wherein said hollow member extends through a hole formed in the porous wick liner of said first heat pipe.

19. The device as in claim 18 wherein said hollow tubular member is non-conductive.

20. The device as in claim 19 further including an annular disc disposed within the recessed chamber of said concave member to prevent contact between said gate means and the interior surface of said chamber.

21. The device as in claim 20 wherein said gate means comprises a continuous gate lead wire having a first integral region thereof bonded to the first base region of the thyristor said continuous gate lead wire having a second integral region thereof extending freely from said first heat pipe, all portions of said gate lead wire between said first region and said second region being disposed within said concave member and said hollow tubular member and electrically insulated therefrom.

22. The device as in claim 17 wherein said gate means comprises a fiber optic light pipe having a first region thereof terminating within said recessed chamber and in optical communication with the first base region of said thyristor, said fiber optic light pipe having a second integral region thereof extending freely from said first heat pipe, all portions of said fiber optic light pipe between said first region and said second region being disposed within said concave member and said hollow tubular member.

23. The device as in claim 22 further including a light deflecting means disposed within said recessed chamber to permit optical communication between said light pipe and said first base region of said thyristor.

24. The device as in claim 17 wherein the interior surface of said concave member is conductive.

25. The device as in claim 24 wherein said gate means comprises:
   a continuous gate lead wire having a first integral region thereof bonded to the interior surface of said concave member adjacent to the control aperture, said continuous gate lead wire having a second integral region thereof extending freely from said first heat pipe, all portions of said gate lead wire between said first region and said second region being disposed within said hollow tubular member, and
   a spring contact having a plurality of contact fingers at one end thereof, said contact fingers being in electrical contact with the interior surface of the concave member, said spring contact having a second end thereof in electrical contact with the first base region of the thyristor.

26. A transcalent transistor device comprises:
   a body of semiconductor material forming a transistor, said transistor having first and second substantially parallel, major opposed surfaces;
   a base electrode and a plurality of emitter electrodes disposed on the first of said major surfaces;
   first electrical contact means including a first heat pipe in electrical and thermal contact with said emitter electrodes, said first heat pipe having an external surface, an internal surface with a porous wick liner bonded thereto and a conductive disc sealing one end thereof, said disc having an aperture extending therethrough;
   base contact means disposed within said aperture in said disc and insulated therefrom, said base contact means being in communication with the base electrode for initiating conduction through said transistor, said base contact means extending through said external and internal surfaces and through said porous wick liner of said heat pipe;

a collector electrode disposed on the second of said major surfaces; and second electrical contact means including a second heat pipe in electrical and thermal contact with substantially all of said collector electrode.

27. The device as in claim 26 wherein said aperture circumscribes a non-conductive concave member having a metallized and plated exterior surface bonded to said disc and a metallized and plated interior surface forming a recessed chamber directed toward the first major surface of said transistor.

28. The device as in claim 27 wherein said concave member includes a control aperture extending through the surfaces thereof.

29. The device as in claim 28 further including a hollow tubular member bonded at one end thereof to the concave member circumscribing said control aperture and at the other end thereof to the external surface of said first heat pipe having an aperture therethrough, said hollow member providing a conduit for a base lead.

30. The device as in claim 29 wherein said hollow tubular member extends through a hole formed in the porous wick liner of said first heat pipe.

31. The device as in claim 30 wherein said base lead has a first integral region bonded to the interior surface of said concave member adjacent to the control aperture and a second integral region extending freely from the first heat pipe, all portions of the base lead between the first region and the second region being disposed within said hollow tubular member.

32. The device as in claim 31 wherein said base contact means comprises a spring contact having a plurality of contact fingers at one end thereof and a base contact region at the other end thereof, said contact fingers being in electrical contact with the interior surface of said concave member and the base contact region being in contact with said base electrode.

33. The device as in claim 26 further including a ballast resistor disposed between the conductive disc of said first heat pipe and the first emitter electrodes on the first of said major surfaces of said transistor, said ballast resistor having a ballast resistor aperture extending therethrough to permit the base contact means to contact the base electrode of said transistor.

* * * * *

UNITED STATES PATENT AND TRADEMARK OFFICE
CERTIFICATE OF CORRECTION

PATENT NO. : 4,386,362

DATED : May 31, 1983

INVENTOR(S) : Sebastian W. Kessler, Jr. et al.

It is certified that error appears in the above-identified patent and that said Letters Patent is hereby corrected as shown below:

Column 1, Line 46 — "preferably" should read -- preferable -- ; and

Column 7, Line 30 — "and" should read -- of -- .

Signed and Sealed this

Twenty-third Day of August 1983

[SEAL]

Attest:

GERALD J. MOSSINGHOFF

Attesting Officer

Commissioner of Patents and Trademarks